(12) United States Patent
Stafford et al.

(10) Patent No.: US 11,105,845 B2
(45) Date of Patent: Aug. 31, 2021

(54) APPARATUS HAVING SIGNAL CHAIN LOCK STEP FOR HIGH INTEGRITY FUNCTIONAL SAFETY APPLICATIONS

(71) Applicant: TEXAS INSTRUMENTS INCORPORATED, Dallas, TX (US)

(72) Inventors: Jeffrey Earl Stafford, Ada, MI (US); Prasanth Viswanathan Pillai, Bangalore (IN); Ashish Arvind Vanjari, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/847,093

(22) Filed: Apr. 13, 2020

(65) Prior Publication Data

US 2020/0309848 A1 Oct. 1, 2020

Related U.S. Application Data

(63) Continuation of application No. 15/584,550, filed on May 2, 2017, now Pat. No. 10,620,260.

(51) Int. Cl.
| | |
|---|---|
| *G01R 31/3187* | (2006.01) |
| *G01R 31/28* | (2006.01) |
| *G01D 3/08* | (2006.01) |
| *B60T 8/88* | (2006.01) |
| *G01R 31/00* | (2006.01) |

(52) U.S. Cl.
CPC .......... *G01R 31/2856* (2013.01); *B60T 8/885* (2013.01); *G01D 3/08* (2013.01); *B60T 2270/406* (2013.01); *B60T 2270/411* (2013.01); *B60T 2270/413* (2013.01); *G01R 31/007* (2013.01); *G01R 31/2829* (2013.01)

(58) Field of Classification Search
CPC .... G01R 31/00; G01R 31/28; G01R 31/2851; G01R 31/3177; G01R 31/3187; G06F 11/277; G06F 17/5045
See application file for complete search history.

(56) References Cited

U.S. PATENT DOCUMENTS

| | | |
|---|---|---|
| 5,334,888 A | 8/1994 | Bodas |
| 5,732,209 A | 3/1998 | Vigil et al. |
| 6,900,643 B2 | 5/2005 | Deng |
| 7,263,642 B1 | 8/2007 | Makar et al. |
| 7,640,469 B2 | 12/2009 | Arnold |

(Continued)

*Primary Examiner* — Minh N Tang
(74) *Attorney, Agent, or Firm* — Brian D. Graham; Charles A. Brill; Frank D. Cimino

(57) ABSTRACT

An integrated circuit (IC) chip for providing a safety-critical value includes first and second processing paths. The first processing path includes a first processing element and is coupled to receive a first input signal on a first input pin and to provide a first output signal that provides the safety-critical value on an output pin. The second processing path includes a second processing element and is coupled to receive a second input signal and to provide a second output signal. The first processing path and the second processing path are independent of each other. A smart comparator on the IC chip receives the first output signal and the second output signal and initiates a remedial action responsive to a difference between the first output signal and the second output signal reaching a configurable threshold.

20 Claims, 5 Drawing Sheets

(56) References Cited

U.S. PATENT DOCUMENTS

| | | |
|---|---|---|
| 2002/0070725 A1 | 6/2002 | Hilliges |
| 2006/0190792 A1* | 8/2006 | Arnold ........... G01R 31/318555 |
| | | 714/736 |
| 2011/0060954 A1 | 3/2011 | Sakada |
| 2012/0166880 A1 | 6/2012 | Greb et al. |
| 2013/0322176 A1 | 12/2013 | Burggraf, III et al. |
| 2018/0203061 A1 | 7/2018 | Sabapathy |
| 2018/0321305 A1 | 11/2018 | Stafford et al. |

* cited by examiner

APPARATUS HAVING SIGNAL CHAIN LOCK STEP FOR HIGH INTEGRITY FUNCTIONAL SAFETY APPLICATIONS

CROSS-REFERENCE TO RELATED APPLICATIONS

This application is a continuation of U.S. patent application Ser. No. 15/584,550 now U.S. Pat. No. 10,620,260, filed May 2, 2017, which is incorporated by reference herein in its entirety.

FIELD OF THE DISCLOSURE

Disclosed embodiments relate generally to the field of providing functional safety applications. More particularly, and not by way of any limitation, the present disclosure is directed to an apparatus and method having signal chain lock step for high integrity functional safety applications.

BACKGROUND

Integrated circuit (IC) chips used in functional safety applications need to have high coverage for random faults. IC chips typically implement a host of different functions, which can include safety critical functions, i.e., critical control functions, along with other non-critical functions, e.g. data-logging, human machine interface, etc. An IC chip needs to provide the highest safety integrity for the critical control functions, lower safety integrity to the non-critical functions, and techniques to ensure the non-interference of lower safety integrity level functions on the higher safety integrity level functions. That is, the system shouldn't automatically go into a safe state during an error in the non-critical functions when the system is still capable of reliably executing the safety critical functions, e.g., when a transient fault occurs during execution of a non-critical function.

SUMMARY

Disclosed embodiments provide improvements in fault detection using a single chip that provides redundancy in the entire signal chain, rather than redundancy only in specific components. Diversity between the different signal chains can provide additional risk reduction to systematic errors by providing improved coverage against bugs in the hardware design, tool set or algorithms utilized. Disclosed embodiments can provide a chip that is pre-certified to meet high safety integrity levels.

In one aspect, an embodiment of an integrated circuit (IC) chip for providing a safety critical value is disclosed. The IC chip includes a first processing path comprising a first processing element, the first processing path coupled to receive a first input signal on a first input pin and to provide a first output signal on an output pin, the first output signal providing the safety-critical value; a second processing path comprising a second processing element, the second processing path coupled to receive a second input signal and to provide a second output signal, the first processing path and the second processing path being independent of each other; and a smart comparator that receives the first output signal and the second output signal and initiates a remedial action responsive to a difference between the first output signal and the second output signal reaching a first threshold, the first threshold being configurable.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Safety Integrity Level (SIL) and Automotive Safety Integrity Level (ASIL) are certifications of the ability of a safety-related system to satisfactorily perform the required safety functions in all specified conditions within a stated period of time. When implementing a new safety-related system, e.g., in the design of a new vehicle, an inspector must provide a level of certification according to the SIL and/or ASIL compliance of the system. The four ASIL levels are defined as ASIL A, ASIL B, ASIL C, ASIL D, with ASIL D indicating the highest integrity requirements on the system and ASIL A the lowest. Similarly, SIL levels 1-4 are defined, with SIL 4 being the most dependable and SIL 1 the least. Typically, to achieve the higher levels of certification, a level of redundancy is necessary in the elements of the system in order to provide an additional level of error-checking.

Figure 5:
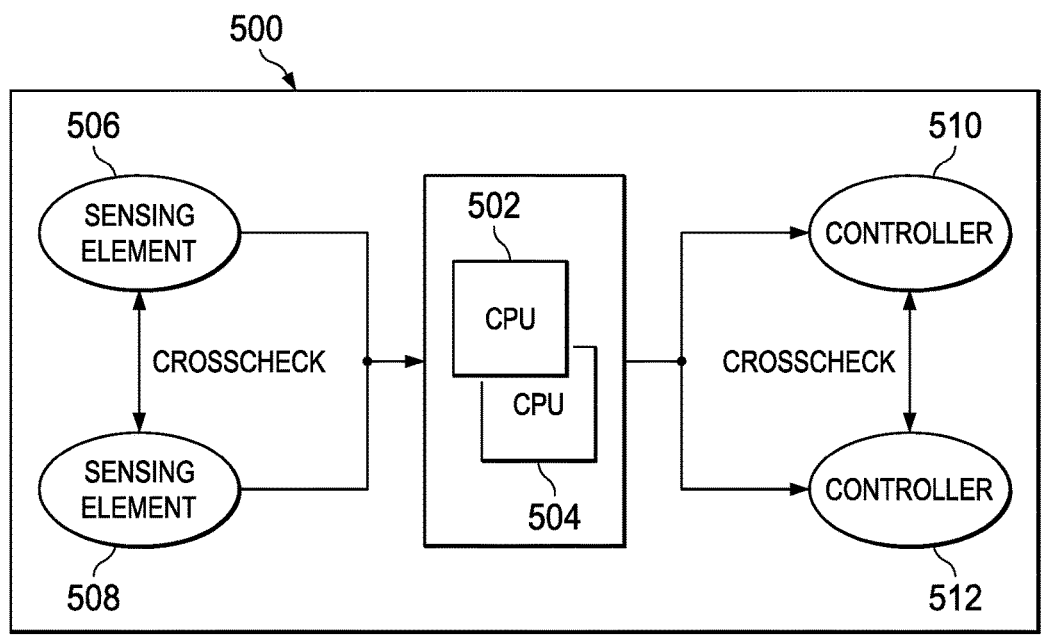
FIG. 5 depicts an example of a system used to provide a safety-critical value according to the prior art.

FIG. 5 depicts a high-level diagram of a system 500 for providing safety-critical control values according to the prior art; in an example embodiment, system 500 controls a safety-critical motor. System 500 can control the operation of the motor through the use of one or more actuators and will receive feedback from the motor through sensors, so that operation of the motor can be continually updated. System 500 utilizes an IC chip that has a pair of lock-stepped homogeneous CPUs 502, 504 running in parallel. CPU 502 is considered the primary processor that will provide control to the motor, while CPU 504 is utilized to double-check the operation of CPU 502 and operates as a slave to CPU 502. Sensing elements 506, 508 can be utilized to provide redundant feedback to CPU 502, with CPU 502 crosschecking sensing elements 506, 508 for equality and providing input to CPU 504. The output value from CPU 502 is provided to controllers 510, 512, so that controllers 510, 512 can provide the final control signal. Controller 510 provides the control signal utilized by the system being controlled, while controller 512 again acts to provide a verification of the accuracy of controller 510. Notably, lock-step systems such as system 500 include common bus interfaces and other common components that need to be separately verified for the safety critical functions.

A comparator (not specifically shown) can be utilized to compare the output of CPUs 502, 504 and to provide an error signal if the output values do not agree with each other. Similarly, a second comparator can be utilized to compare the output signals of controllers 510, 512 and to provide an error signal when the output signals do not agree with each other. Either of these error signals can be utilized to place the controlled system into a safe mode. It can be recognized that similar values will be received from the sensors by CPU 502 and passed to CPU 504 and a same value will be passed by CPU 502 to both of controllers 510, 512. Because of this, the cross-checking performed by the comparators is a simple comparison of values. In these traditional systems, only the processing elements are verified by the hardware-based comparison logic.

Figure 6:
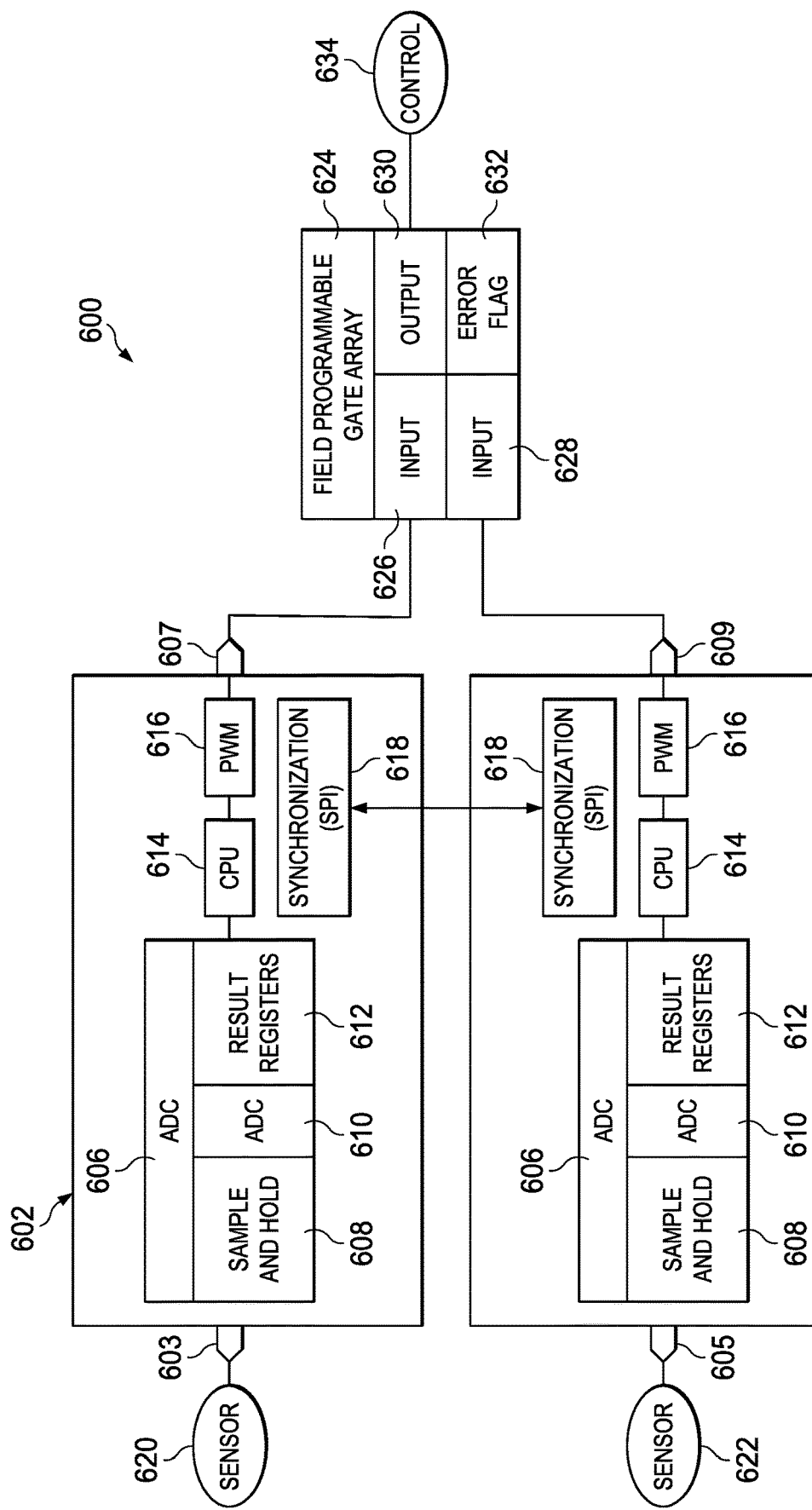
FIG. 6 depicts an example of a system used to provide a safety-critical value according to the prior art.

Another system 600 for providing safety-critical values is shown in FIG. 6. System 600 includes IC chips 602, 604; each of IC chips 602, 604 contains an entire processing path from sensor input to control output. IC chip 602 receives input from sensor 620 on input pin 603 and provides an output signal on output pin 607. Similarly, IC chip 604 receives input from sensor 622 on input pin 605 and provides an output signal on output pin 609. The output values from IC chip 602, 604 are received at Field Programmable Gate Array (FPGA) 624, which is programmed as a comparator to compare the output values. Input 626 of FPGA 624 receives the output value of IC chip 602 and input 628 receives the output value of IC chip 604. Due to the behavior of the analog sensor and sensor processing, there can be difference in the final output. Hence, the comparator at the output needs to be smart enough to understand the differences and differentiate between an acceptable error and non-acceptable one. If input 626 agrees with input 628 (i.e. acceptable error), a new value is provided at output 630 and sent as control signal 634; if input 626 does not agree with input 628 (i.e. non-acceptable error), an error flag 632 is set and the system is put into safe mode.

Within each of IC chips 602, 604 are an Analog-to-Digital Converter (ADC) 606, which includes sample-and-hold hardware 608, ADC 610, and result registers 612. Each of IC chips 602, 604 also includes a CPU 614 and controllers, which in the embodiment shown are Pulse Width Modulators (PWMs) 616. To ensure close synchronization between IC chip 602 and IC chip 604, each of IC chips 602, 604 also contains synchronization module 618. The two synchronization modules 618 communicate with each other using serial communication identified by a Serial Peripheral Interface (SPI). Synchronization modules 618 keep the two IC chips synchronized to allow the output signals to be compared by the FPGA. Hardware redundancy for the sensor elements, e.g., ADCs 606, and actuator functions, e.g., PWMs 616, are also cross-checked using software to compare the redundant elements and ensure fault-free operation. System 600 provides redundancy of the entire signal chain.

Figure 1:
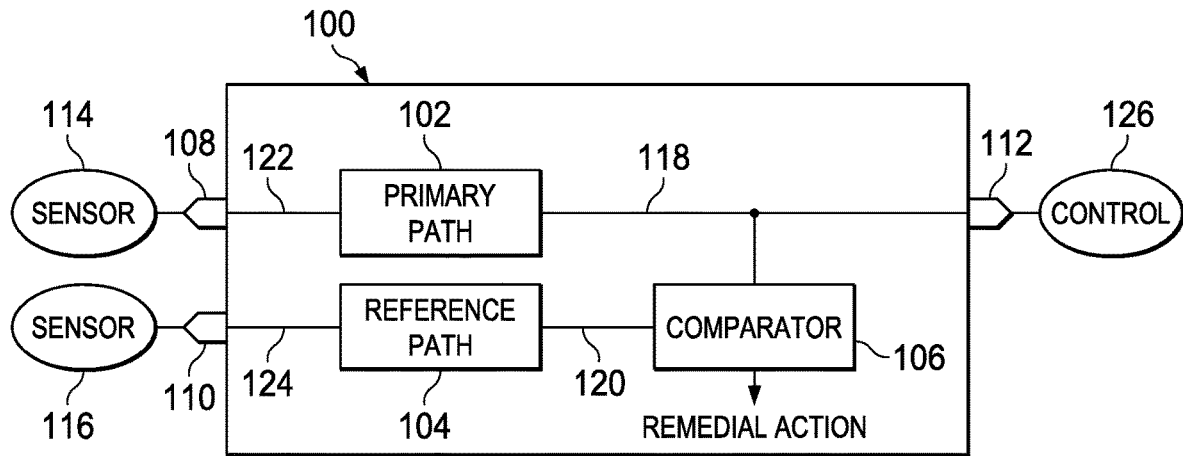
FIG. 1 depicts an example of an integrated circuit chip according to an embodiment of the disclosure.

Referring now to FIG. 1, a high-level view of an IC chip 100 for providing a safety-critical value is depicted. IC chip 100 contains both a primary path 102, which is able to receive input 122 from sensor 114 on input pin 108 and provide a control signal 118, which is output on output pin 112 as control signal 126, and a secondary or reference path 104, which is able to receive input signal 124 from sensor 116 on input pin 110 and provide a second control signal 120. IC chip 100 also contains a comparator 106, which receives the control signals 118, 120 from both primary path 102 and reference path 104 to ensure reliability of control signal 118. If the outputs from primary path 102 and reference path 104 do not match within an acceptable range, comparator 106 is able to initiate a remedial action to ensure safety. In the disclosed architecture, instead of redundancy in only specific elements, with buses and other elements shared by the two pathways, the complete signal chain is redundant and the PWM outputs are verified by the hardware-based comparator 106. In one embodiment, this comparison occurs for every PWM transition and results in a lock-stepped PWM output, although it will be understood that the comparison can be based on triggers other than every PWM transition without deviating from the disclosed embodiments. In one embodiment, primary path 102, reference path 104, and comparator 106 are implemented in hardware.

The disclosed embodiment implements signal chain lock-step (SCL), which provides hardware redundancy for all the modules and buses implementing safety critical functions to provide the highest safety integrity level control functions. All redundant safety critical modules are verified to be operating correctly by using comparator 106 at the output. Non-critical functions are not protected by SCL and can be executed without the lock-step. In one example embodiment, both the primary path 102 and reference path 104 are included in separate, trusted, secure environments, so that all critical functions are protected. Non-critical functions can be executed in an unsecure environment that prevents these non-critical functions from interfering with the critical functions. Mechanisms to prevent interference with the operation of critical functions by non-critical functions can include, e.g., memory ownership, peripheral ownership, etc., but these mechanisms are outside the scope of this application and are not discussed further.

It can be noted that during certification under SIL or ASIL standards, an IC chip needs to demonstrate a capability to mitigate random faults. Due to the computational complexity involved in complete fault injection for a control system, fault injection is typically maximized in certain areas of concern. Using the disclosed methodology of complete signal path redundancy, demonstrating the capability to mitigate random faults becomes easier compared to that of a lock-stepped system with modules having hardware redundancy but sharing a common bus infrastructure.

A further advantage of the disclosed IC chip 100 is the ability to select different processors and/or different algorithms that produce the same or nearly the same results. The use of heterogeneous processors or algorithms in primary path 102 and reference path 104 improves the diversity of the solution and can provide improved coverage against systematic failures from bugs in the hardware design, instruction set architectures, code-generation tools, and algorithm.

Figure 2:
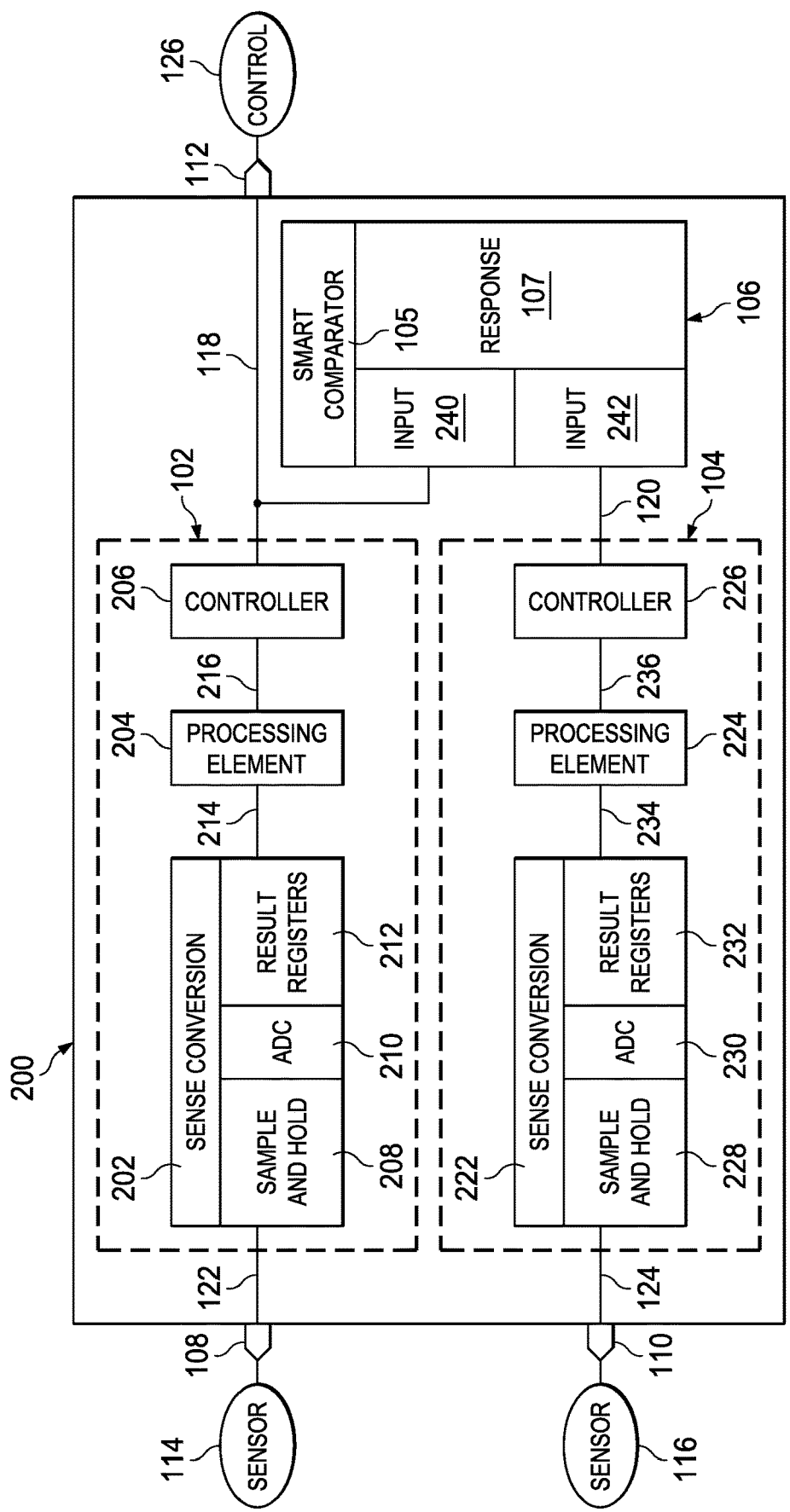
FIG. 2 depicts a more detailed example of an integrated circuit chip according to an embodiment of the disclosure.

FIG. 2 depicts in greater detail an example IC chip 200 for providing safety-critical values. As noted above, the implementation of SCL includes complete redundancy of the entire signal chain, from input to compute to output, and finally a comparison of the redundant outputs; the controller 206 can be a PWM, although it will be recognized that other types of control signals can also be produced. In IC chip 200, primary path 102 includes sense conversion element 202, processing element 204 and controller 206. Although an ADC is utilized in the example embodiments, it will be understood that the sense conversion element can also be an input capture (CAP), a quadrature encoder interface (QEP) or any other type of sense conversion element known or currently unknown. In one embodiment, sense conversion element 202 includes sample-and-hold hardware 208, ADC 210 and results registers 212. Together these hardware components receive a sampled analog signal from the sensor (s) and convert the analog signal to a digital signal 214. Processing element 204 provides processing of the digital signal 214 to provide a processed signal 216 to controller 206 and controller 206 provides a resulting pulse width modulated signal as control signal 118. The control signal 118 of controller 206 is provided both to output pin 112 as control signal 126 and to the smart comparator 105. In one embodiment, the comparator is implemented in a Configurable Logic Block (CLB), although the comparator can also be implemented in hardware. Smart comparator 105 is configured to include two inputs 240, 242 and a response 107. As shown, input 240 receives the control signal 118 of primary path 102 and input 242 receives the control signal 120 of reference path 104. Similar to primary path 102, reference path 104 includes controller 226, processing element 224 and sense conversion element 222; sense conversion element 222 includes sample-and-hold hardware 228, ADC 230 and results registers 232. Sense conversion element 222 receives input signal 124 and provides digital signal 234 to processing element 224. Processing element 224 processes the signal and provides processed signal 236 to controller 226. The control signal 120 of controller 226 is provided to input 242 of smart comparator 105. Notably, the inputs to processing element 204 and processing element 224 are driven from different sense conversion elements 202, 222 that are physically separated and will drive two different controllers 206, 226.

Each of the outputs of controllers 206, 226 represents the functionality of the entire signal chain for the respective path. If any of the sub-systems that are a part of the signal chain are faulty, the output will reflect this failure and will be detected with comparison logic. Upon detecting the fault, the comparison logic puts the system into a safe state and reports the error to the CPUs and externally to the system. When the outputs are PWMs, all PWMs will be disabled without requiring software involvement.

In one embodiment, processing element 204 is a C28x processor and processing element 224 is a Control Law Accelerator (CLA) processor, both manufactured by Texas Instruments Incorporated. These two CPUs have different architectures, instruction sets and code-generation tools for implementing the two different processing paths. In at least one embodiment, processing element 204 utilizes a first algorithm to process the digital signal received from sense conversion element 202 and processing element 224 utilizes a second algorithm to process the digital signal received from sense conversion element 222 to provide increased diversity. This second algorithm can different from the first algorithm to provide diversity. Using the different algorithms means that slightly different answers may be achieved using primary path 102 and reference path 104. The comparator 106 for the final output receives inputs at 240 and 242 and is a smart comparator that provides more than a simple comparison of the values provided by the controllers 206, 226.

When the output is a pulse-width modulated signal, comparator 106 will compare the PWM outputs and can perform one or more of the following:

Detecting illegal conditions, e.g., high-side and low-side drives of a power amplifier driven high simultaneously;

Detecting when PWM output remains low for a configurable time period; and

Checking that rising and falling transitions of the redundant PWM pairs are within a configurable period.

Other conditions can also be detected as necessary or desired. The configurable period provided in order to adjust for variations from:

Sensors, if multiple sensors are used;

Sampled analog signals;

Diversity of CPUs 204, 224, e.g., architecture, binary encoding of the instructions, code-generation tools, and optionally source code.

Physical systems, such as electric motors, can tolerate a certain amount of variability in the PWM. The configurable period is programmable to a value less than the tolerance of the system.

Figure 3:
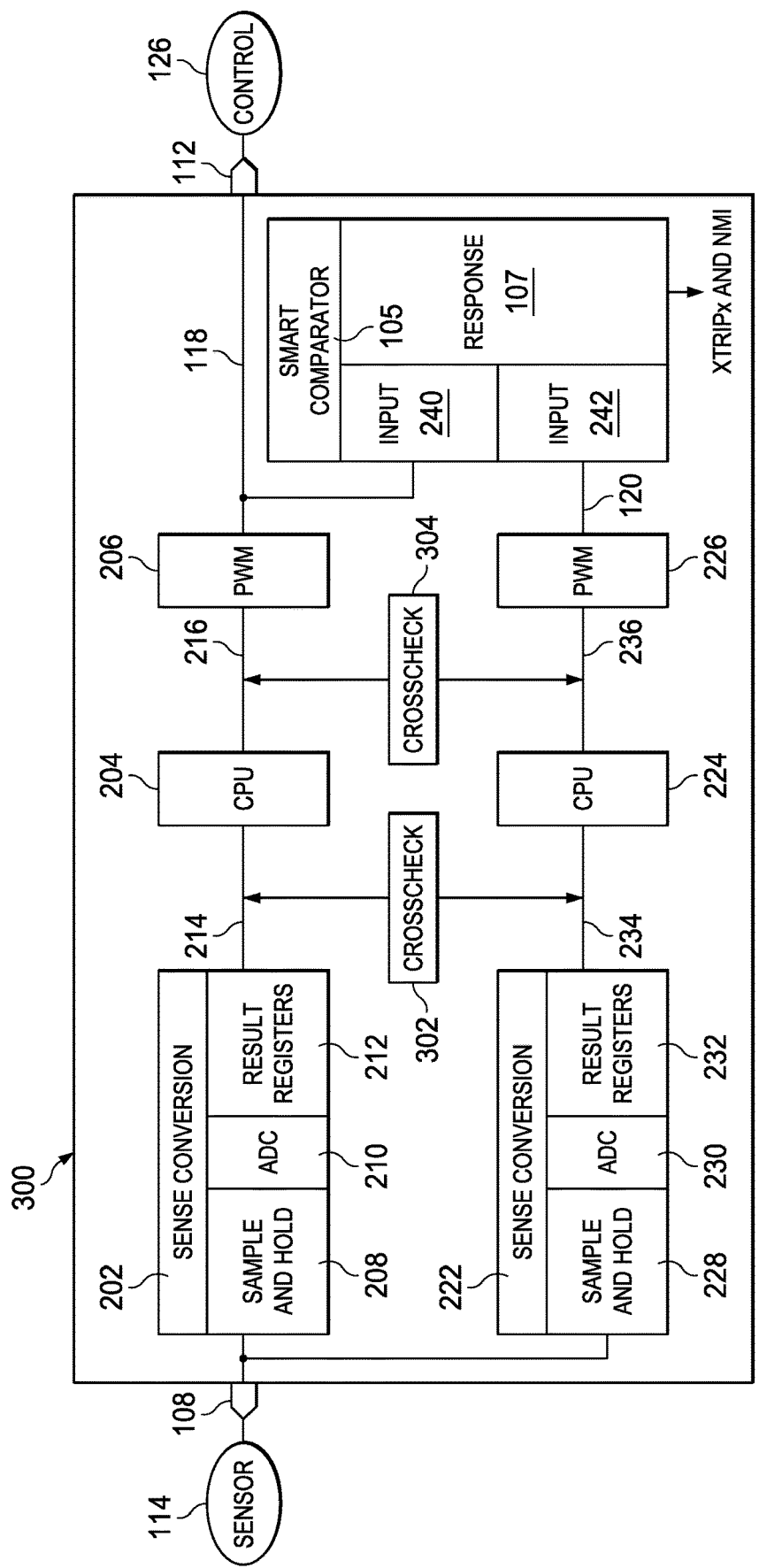
FIG. 3 depicts an example of an integrated circuit chip according to an embodiment of the disclosure.

Variations on the basic structures of FIGS. 1 and 2 are depicted in FIG. 3. FIG. 3 depicts an embodiment of an IC chip 300 for providing safety-critical values in which a single sensor 114 is utilized to provide inputs to both sense conversion element 202 and sense conversion element 222. When a single sensor is used, then the signal received on input pin 108 is mapped to both sense conversion element 202 and sense conversion element 222. IC chip 300 further illustrates an embodiment in which a cross-check module 302 checks the digital signals 214, 234 of the sense conversion elements 202, 222 with software. Similarly, crosscheck module 304 will crosscheck the processed signal 216 provided by processing element 224 against the processed signal 236 provided by processing element 204. Synchronization between processing elements will be required to account for accumulated error for each execution of the signal chain. In this manner, diversity in the pathways can be provided without introducing unintended errors at comparator 106. The use of different variations in a single embodiment, e.g., the use of a single sensor to provide the input for both processing paths and the use of cross-check modules in an example embodiment does not imply that these elements must always be utilized together, as the use of these variations are independent of each other.

Figure 4A:
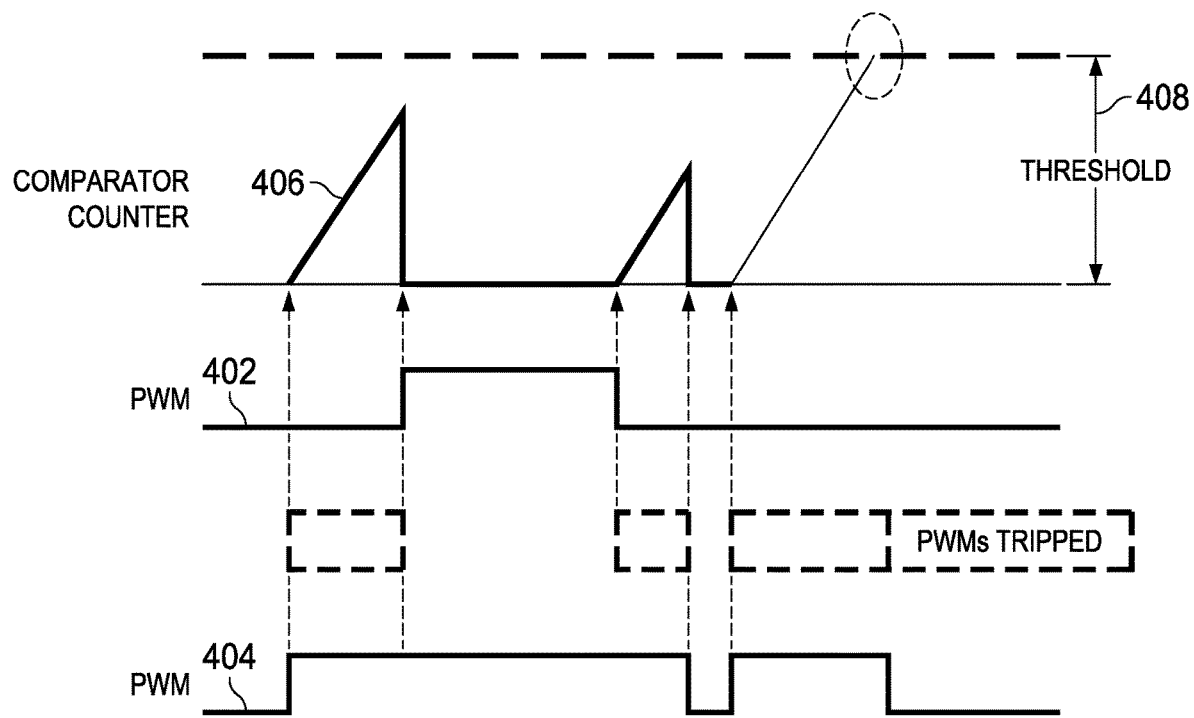
FIG. 4A depicts an example of comparisons made by the smart comparator according to an embodiment of the disclosure.

FIG. 4A depicts an example of the comparisons that can be made by comparator 106 when used with redundant PWMs for pathways having diversity features and a programmable threshold tolerance. PWM signal 402 is produced by controller 206 and PWM signal 404 is produced by controller 226. In this example, each rising edge or falling edge of one of PWM signals 402, 404 initiates a comparator counter 406. In the illustrated example, a rising edge of PWM signal 404 initiates comparator counter 406 to begin rising at a known rate, and then a rising edge of PWM signal 402 resets comparator counter 406 to zero. Next a falling edge of PWM signal 402 initiates comparator counter 406 to start rising again and the falling edge of PWM signal 404 resets comparator counter 406 to again return to zero. Since the comparator counter 406 did not reach threshold 408 while incrementing, no fault was detected. A next rising edge of PWM signal 404 again initiates comparator counter 406 to begin rising. In this instance, before another rising or falling edge could reset comparator counter 406 to return to zero, counter 406 reaches threshold 408. This triggers a remedial action, which is typically to trip all PWMs and place the chip in a safe mode.

Figure 4B:
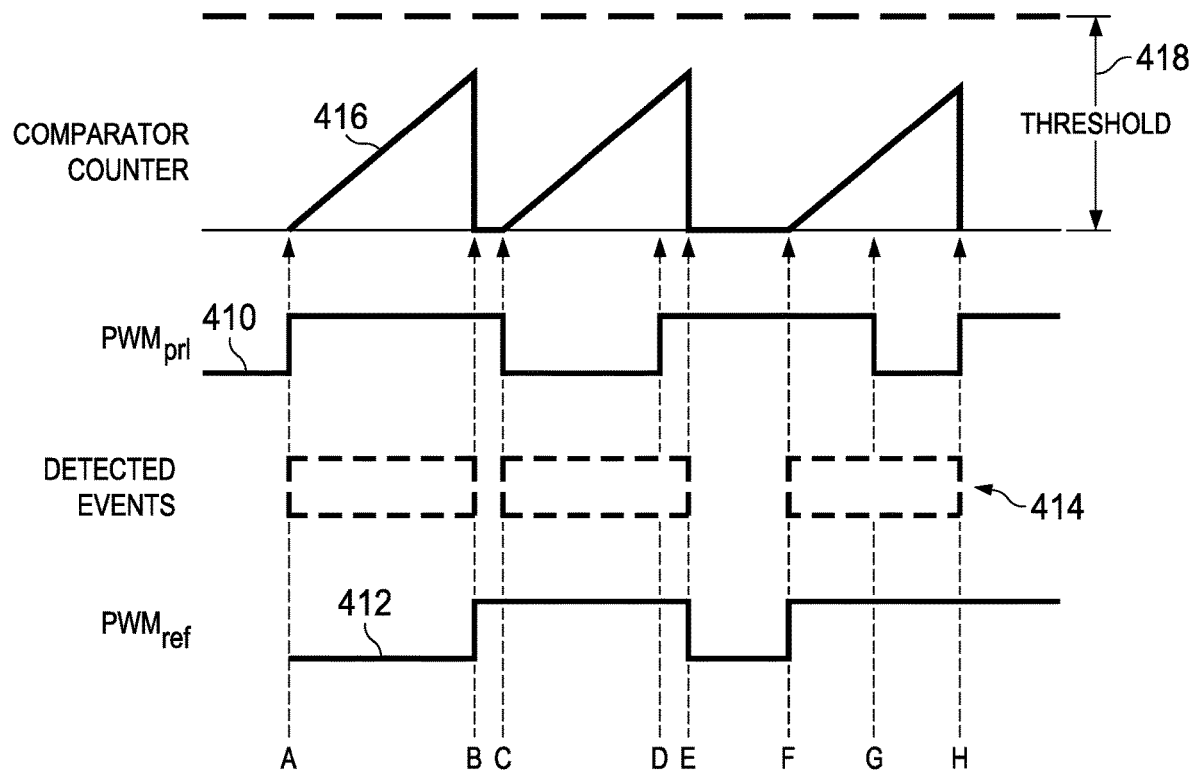
FIG. 4B depicts an example of comparisons made by the smart comparator according to an embodiment of the disclosure.

FIG. 4B depicts another example embodiment, also using PWM signals. In the embodiment of FIG. 4B, the signal $PWM_{PRI}$ 410 produced by the primary path and the signal $PWM_{REF}$ 412 produced by the redundant path are shown, along with detected events 414 and the value of the comparator counter 416 with regard to threshold 418. Detected events 414 depicts a time period in which the counter is active. In this embodiment, the counter 416 is started on the first edge detected in either path, whether that edge is rising or falling. The logic then looks for a matching edge on the opposite path, i.e., if the initial edge is rising, the matching edge will be rising also and if the first edge is detected on signal $PWM_{REF}$, the matching edge will be looked for on signal $PWM_{PRI}$. A falling edge on the opposite path is ignored. Once a matching edge on the opposite path is detected, the counter 416 is reset. The counter 416 will be started again when a next edge is detected in either path; the logic then searches for a matching edge in the opposite path. In the example shown, each rising or falling edge has been annotated with a letter A-H. A rising edge on $PWM_{PRI}$ 410 is detected at point A and counter 416 is started. The next edge at point B is a rising edge on $PWM_{REF}$ 412, so counter 416 is reset. A falling edge is detected on $PWM_{PRI}$ 410 at point C and counter 416 is again started. The rising edge on $PWM_{PRI}$ 410 at point D is ignored, since the logic is currently looking for a falling edge on $PWM_{REF}$ 412. The falling edge on $PWM_{REF}$ 412 is detected at point E and counter 416 is reset. The next edge is a rising edge on $PWM_{REF}$ 412 at point F and counter 416 is started. At point G, a falling edge on $PWM_{PRI}$ 410 is detected, but is ignored, as the logic is looking for a rising edge on $PWM_{PRI}$ 410. At point H, a rising edge is detected on $PWM_{PRI}$ 410 and counter 416 is reset. At no time was the threshold 418 reached. It will be understood that other embodiments can contain comparisons not mentioned herein, as the exact comparisons made are not critical to the operation of the disclosed embodiments. Of course, in embodiments that provide an output signal other than a PWM signal, the types of comparisons can be different from those shown. Notably, these illustrations are not meant to provide limitations of any comparisons that can be made, but merely to illustrate methods by which a threshold can be utilized to provide robustness to the IC chip when diversity is introduced.

The disclosed embodiments provide hardware redundancy for critical input and output peripherals, as well as buses that allow communication between the CPU and peripherals. These embodiments also allow the use of diverse processing elements and/or algorithms utilized to provide the output signal and provide a smart comparator that can enter a safe state without software involvement, e.g., by tripping PWM outputs and flagging an error when there is potential to violate the safety goals. Benefits of the disclosed embodiments include faster fault detection, which enables safety in systems with tight control loop timing, and better fault coverage. With both the primary path and redundant path implemented in hardware, the disclosed embodiments have minimal performance impact and leave processor performance available for application tasks rather than processor diagnostics. There is also minimal memory impact using the disclosed embodiments, as on-chip memory can be utilized for applications rather than processor diagnostics. The disclosed IC chips provide easy integration into developing systems, improving time-to-market by eliminating the need to integrate complex software. Since the disclosed IC chips can be pre-certified to meet specific SIL and ASIL levels, users can spend less time proving a processor safety solution to auditors, leaving more time for application development.

Although various embodiments have been shown and described in detail, the claims are not limited to any particular embodiment or example. Elements shown in one embodiment are not limited to the environment in which these elements are shown and can be combined with elements shown in other embodiments. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An integrated circuit comprising:
a first processing path that includes a first processing element, the first processing path configured to receive a first input signal and to provide a first output signal in response to the first input signal;
a second processing path that includes a second processing element, the second processing path configured to receive a second input signal and to provide a second output signal in response to the second input signal; and
a comparator coupled to the first processing path and the second processing path and operable to:
receive the first output signal and the second output signal;
determine a delay between a transition of the first output signal and a corresponding transition of the second output signal;
compare the delay to a threshold; and
provide a trigger for a remedial action based on the delay exceeding the threshold.

2. The integrated circuit of claim 1, wherein the first processing path is separate from the second processing path.

3. The integrated circuit of claim 1, wherein:
the first processing path is coupled to a first sensor to receive the first input signal from the first sensor; and the second processing path is coupled to a second sensor that is different from the first sensor to receive the second input signal from the second sensor.

4. The integrated circuit of claim 1, wherein:
the first processing path is coupled to a sensor to receive the first input signal from the sensor; and
the second processing path is coupled to the sensor to receive the second input signal from the sensor.

5. The integrated circuit of claim 1, wherein:
the first processing element provides the first output signal in response to the first input signal according to a first algorithm; and
the second processing element provides the second output signal in response to the second input signal according to a second algorithm that is different from the first algorithm.

6. The integrated circuit of claim 1, wherein the comparator is configured to provide the trigger when the first output signal remains in a state for longer than a threshold amount of time.

7. The integrated circuit of claim 1, wherein:
the first processing path includes a first sample-and-hold circuit and a first analog-to-digital converter coupled to receive the first input signal and to provide a first intermediate signal;
the second processing path includes a second sample-and-hold circuit and a second analog-to-digital converter coupled to receive the second input signal and to provide a second intermediate signal; and
the integrated circuit comprises a first crosscheck circuit coupled to the first analog-to-digital converter and to the second analog-to-digital converter and configured to compare the first intermediate signal to the second intermediate signal.

8. The integrated circuit of claim 7, wherein:
the first processing element is coupled to the first analog-to-digital converter and is configured to provide a third intermediate signal in response to the first intermediate signal;
the second processing element is coupled to the second analog-to-digital converter and is configured to provide a fourth intermediate signal in response to the second intermediate signal; and
the integrated circuit comprises a second crosscheck circuit coupled to the first processing element and to the second processing element and configured to compare the third intermediate signal to the fourth intermediate signal.

9. The integrated circuit of claim 8, wherein:
the first processing path includes a pulse width modulator coupled to the first processing element and configured to receive the third intermediate signal and to provide the first output signal in response to the third intermediate signal; and
the second processing path includes a second width modulator coupled to the second processing element and configured to receive the fourth intermediate signal and to provide the second output signal in response to the fourth intermediate signal.

10. The integrated circuit of claim 1, wherein the integrated circuit is configured to provide the first output signal as a control signal.

11. A method comprising:
receiving, by a first processing path, a first input signal;
providing, by the first processing path, a first output signal in response to the first input signal;
receiving, by a second processing path, a second input signal;
providing, by the second processing path, a second output signal in response to the second input signal;
determining a delay between a transition of the first output signal and a corresponding transition of the second output signal; and
providing a trigger for a remedial action based on the delay exceeding a threshold.

12. The method of claim 11, wherein:
the first input signal is received from a first sensor; and
the second input signal is received from a second sensor.

13. The method of claim 11, wherein:
the first input signal is received from a sensor; and
the second input signal is received from the sensor.

14. The method of claim 11, wherein:
the providing of the first output signal in response to the first input signal uses a first algorithm; and
the providing of the second output signal in response to the second input signal uses a second algorithm that is different from the first algorithm.

15. The method of claim 11, wherein:
the trigger is a first trigger; and
the method further comprises:
providing a second trigger when the first output signal remains in a state for longer than a threshold amount of time.

16. The method of claim 11, wherein:
the providing of the first output signal includes performing an analog-to-digital conversion of the first input signal to produce a first intermediate signal;
the providing of the second output signal includes performing an analog-to-digital conversion of the second input signal to produce a second intermediate signal; and
the method further comprises comparing the first intermediate signal to the second intermediate signal.

17. The method of claim 16, wherein:
the providing of the first output signal includes processing the first intermediate signal using a first processing element to produce a third intermediate signal;
the providing of the second output signal includes processing the second intermediate signal using a second processing element to produce a fourth intermediate signal; and
the method further comprises comparing the third intermediate signal to the fourth intermediate signal.

18. The method of claim 17, wherein:
the providing of the first output signal includes processing the third intermediate signal using a first pulse-width modulator to produce the first output signal; and
the providing of the second output signal includes processing the fourth intermediate signal using a second pulse-width modulator to produce the second output signal.

19. The method of claim 18 further comprising performing the remedial action in response to the trigger, wherein the remedial action includes performing a trip of the first pulse-width modulator and of the second pulse-width modulator.

20. The method of claim 11 further comprising providing the first output signal to control a motor.

* * * * *